(12) United States Patent
Son et al.

(10) Patent No.: US 12,660,549 B2
(45) Date of Patent: Jun. 16, 2026

(54) CLEANING DEVICE AND APPARATUS FOR PROCESSING A SUBSTRATE

(71) Applicant: SEMES CO., LTD., Cheonan-si (KR)

(72) Inventors: Youngjun Son, Cheonan-si (KR); Kisang Eum, Cheonan-si (KR); Wonsik Son, Hwaseong-si (KR)

( * ) Notice: Subject to any disclaimer, the term of this patent is extended or adjusted under 35 U.S.C. 154(b) by 713 days.

(21) Appl. No.: 18/145,327

(22) Filed: Dec. 22, 2022

(65) Prior Publication Data

US 2023/0207340 A1 Jun. 29, 2023

(30) Foreign Application Priority Data

Dec. 28, 2021 (KR) .......................... 10-2021-0189878

(51) Int. Cl.
| | |
|---|---|
| *B08B 3/02* | (2006.01) |
| *B08B 13/00* | (2006.01) |
| *G03F 7/00* | (2006.01) |
| *H10P 72/00* | (2026.01) |
| *H10P 72/72* | (2026.01) |
| *H10P 72/76* | (2026.01) |
| *H10P 72/78* | (2026.01) |

(52) U.S. Cl.
CPC ............ *H10P 72/0414* (2026.01); *B08B 3/02* (2013.01); *B08B 3/022* (2013.01); *B08B 13/00* (2013.01); *G03F 7/70925* (2013.01); *H10P 72/0406* (2026.01); *H10P 72/0412* (2026.01); *H10P 72/72* (2026.01); *H10P 72/7608* (2026.01); *H10P 72/7624* (2026.01); *H10P 72/78* (2026.01)

(58) Field of Classification Search
None
See application file for complete search history.

(56) References Cited

U.S. PATENT DOCUMENTS

2018/0209042 A1* 7/2018 Wu ..................... C23C 16/4404

FOREIGN PATENT DOCUMENTS

| | | |
|---|---|---|
| KR | 2015-0011764 A | 2/2015 |
| KR | 2017-0077084 A | 7/2017 |
| KR | 2019-0054943 A | 5/2019 |
| KR | 2020-0055436 A | 5/2020 |

* cited by examiner

*Primary Examiner* — Levon J Shahinian

(57) ABSTRACT

A cleaning device for cleaning a rear face of a substrate may include a housing, an electrostatic chuck disposed in the housing wherein the substrate is placed on the electrostatic chuck, at least one adsorption member configured to place the substrate onto the electrostatic chuck, a driving member configured to rotate the electrostatic chuck, a circulation member coupled to the driving member and configured to form a circulating airflow for preventing scattering of a cleaning solution in the housing, at least one auxiliary circulation member disposed adjacent to the circulation member wherein the at least one auxiliary circulation member includes a circulation hole for the circulating airflow, and at least one nozzle disposed adjacent to the at least one auxiliary circulation member and configured to the cleaning solution onto the rear face of the substrate.

20 Claims, 5 Drawing Sheets

200

CLEANING DEVICE AND APPARATUS FOR PROCESSING A SUBSTRATE

CROSS-REFERENCE TO RELATED APPLICATION

This application claims priority to Korean Patent Application No. 2021-0189878 filed on Dec. 28, 2021 in the Korean Intellectual Property Office (KIPO), the contents of which are herein incorporated by reference in its entirety.

BACKGROUND

1. Field

Example embodiments of the invention relate to a cleaning device and an apparatus for processing a substrate. More particularly, example embodiments of the invention relate to a cleaning device capable of effectively cleaning a rear face of a substrate, and an apparatus for processing a substrate including such a cleaning device.

2. Related Technology

An integrated circuit device or a display device may be generally manufactured through various processes such as a deposition process, an exposure process, an etching process, a cleaning process, a drying process, etc. Particularly, as the integrated circuit device or the display device includes minute patterns, a precise exposure process may be needed to form the minute patterns on a substrate. If particles or impurities remain on a rear face of the substrate in the exposure process, a defocus phenomenon may be locally caused by the particles or impurities on the rear face of the substrate. Therefore, defects may be generated in the minute patterns formed on the substrate.

To avoid the local defocus phenomenon in the exposure process, a cleaning process may be performed on the rear face of the substrate. In the conventional cleaning process, a cleaning solution may be sprayed onto the rear face while rotating the substrate on an electrostatic chuck so that a portion of the cleaning solution may scattered onto a front face of the substrate, and also the cleaning solution may be partially permeated into the electrostatic chuck. If the cleaning solution remains on the front face of the substrate, defects such as stains may be generated on the front face of the substrate.

SUMMARY

One aspect of the invention provides a cleaning device capable of effectively cleaning a rear face of a substrate while preventing defects on the substrate caused by a cleaning solution.

Another of the invention provides an apparatus for processing a substrate including a cleaning device capable of effectively cleaning a rear face of a substrate while preventing defects on the substrate caused by a cleaning solution.

According to an aspect of the invention, there is provided a cleaning device for cleaning a rear face of a substrate. The cleaning device may include a housing; an electrostatic chuck disposed in the housing wherein the substrate is placed on the electrostatic chuck; at least one adsorption member configured to place the substrate onto the electrostatic chuck; a driving member configured to rotate the electrostatic chuck; a circulation member coupled to the driving member and configured to form a circulating airflow for preventing scattering of a cleaning solution in the housing; at least one auxiliary circulation member disposed adjacent to the circulation member wherein the at least one auxiliary circulation member includes a circulation hole for the circulating airflow; and at least one nozzle disposed adjacent to the at least one auxiliary circulation member and configured to the cleaning solution onto the rear face of the substrate.

In example embodiments, the cleaning device may include a first adsorption member and a second adsorption member configured to adsorb peripheral portions of the substrate, respectively.

In example embodiments, the circulation member may have an opening through which the driving member passes and the circulation member is engaged with an outer circumference face of the driving member.

In example embodiments, the circulation member may include blades for generating the airflow in the housing.

In some example embodiments, a direction of the airflow may be changed in the housing by changing an arrangement of the blades of the circulation member.

In example embodiments, the cleaning device may additionally include a fixing member configured to fix the circulation member to the driving member.

In example embodiments, the cleaning device may include a first auxiliary circulation member and a second auxiliary circulation member, and each of the first and second auxiliary circulation members may have the circulation hole through which the airflow passes.

In example embodiments, each of the first auxiliary circulation member and the second auxiliary circulation member may make contact with a bottom of the housing and may extend between inner sidewalls of the housing.

In example embodiments, the airflow may circulate along a circulation pathway formed between the at least one adsorption member and the rear face of the substrate, between the at least one nozzle and an inner sidewall of the housing, and in the circulation hole of the at least one auxiliary circulation member.

According to another aspect of the invention, there is provided a cleaning device for cleaning a rear face of a substrate. The cleaning device may include a housing; an electrostatic chuck disposed in the housing wherein the substrate is placed on the electrostatic chuck; a first adsorption member and a second a first adsorption member configured to place the substrate onto the electrostatic chuck; a driving member configured to rotate the electrostatic chuck; a circulation member coupled to the driving member and configured to form a circulating airflow for preventing scattering of a cleaning solution in the housing; a first auxiliary circulation member and a second auxiliary circulation member disposed adjacent to the circulation member, respectively, wherein the first and the second auxiliary circulation members include circulation holes for the circulating airflow; and a first nozzle and a second nozzle disposed adjacent to the first auxiliary circulation member and the second auxiliary circulation member, respectively, and configured to the cleaning solution onto the rear face of the substrate.

In example embodiments, the cleaning device may additionally include a fixing member configured to fix the circulation member to the driving member.

In example embodiments, the circulation member may include blades for generating the airflow in the housing.

In some example embodiments, a direction of the airflow may be changed in the housing by changing an arrangement of the blades of the circulation member.

In example embodiments, each of the first auxiliary circulation member and the second auxiliary circulation member may make contact with a bottom of the housing and may extend between inner sidewalls of the housing.

In example embodiments, the airflow may circulate a circulation pathway formed between the first adsorption member and the rear face of the substrate, between the first nozzle and an inner sidewall of the housing, in the circulation hole of the first auxiliary circulation member, between the second adsorption member and the rear face of the substrate, between the second nozzle and the inner sidewall of the housing, and in the circulation hole of the second auxiliary circulation member.

According to still another aspect of the invention, there is provided an apparatus for processing a substrate. The apparatus for processing a substrate may include a process chamber configured to perform a desired process on the substrate; and a cleaning device configured to clean a rear face of the substrate before the substrate is loaded into the process chamber and/or after the substrate is unloaded from the process chamber. The cleaning device may include a housing; an electrostatic chuck disposed in the housing wherein the substrate is placed on the electrostatic chuck; a first adsorption member and a second a first adsorption member configured to place the substrate onto the electrostatic chuck; a driving member configured to rotate the electrostatic chuck; a circulation member coupled to the driving member and configured to form a circulating airflow for preventing scattering of a cleaning solution in the housing; a first auxiliary circulation member and a second auxiliary circulation member disposed adjacent to the circulation member, respectively, wherein the first and the second auxiliary circulation members include circulation holes for the circulating airflow; and a first nozzle and a second nozzle disposed adjacent to the first auxiliary circulation member and the second auxiliary circulation member, respectively, and configured to the cleaning solution onto the rear face of the substrate.

In example embodiments, the process chamber may include an exposure chamber.

In some example embodiments, the circulation member may include blades for generating the airflow in the housing and a direction of the airflow may be changed in the housing by changing an arrangement of the blades of the circulation member.

In example embodiments, each of the first auxiliary circulation member and the second auxiliary circulation member may make contact with a bottom of the housing and may extend between inner sidewalls of the housing.

In example embodiments, the airflow may circulate a circulation pathway formed between the first adsorption member and the rear face of the substrate, between the first nozzle and an inner sidewall of the housing, in the circulation hole of the first auxiliary circulation member, between the second adsorption member and the rear face of the substrate, between the second nozzle and the inner sidewall of the housing, and in the circulation hole of the second auxiliary circulation member.

According to example embodiments, the cleaning device may clean the rear face of the substrate before the substrate is loaded into the process chamber and/or after the substrate is unloaded from the process chamber. The circulating airflow may be generated by the circulation member in the housing so that the cleaning solution sprayed onto the rear face of the substrate from the first and second nozzles may not be scattered onto a front face of the substrate as well as may not be permeated into the electrostatic chuck. As a result, defects generated on the front face of the substrate may be prevented and also the rear face of the substrate may be effectively cleaned. Further, the cleaning solution may not be permeated into the electrostatic chuck such that the failure of the electrostatic chuck caused by the cleaning solution may be prevented.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
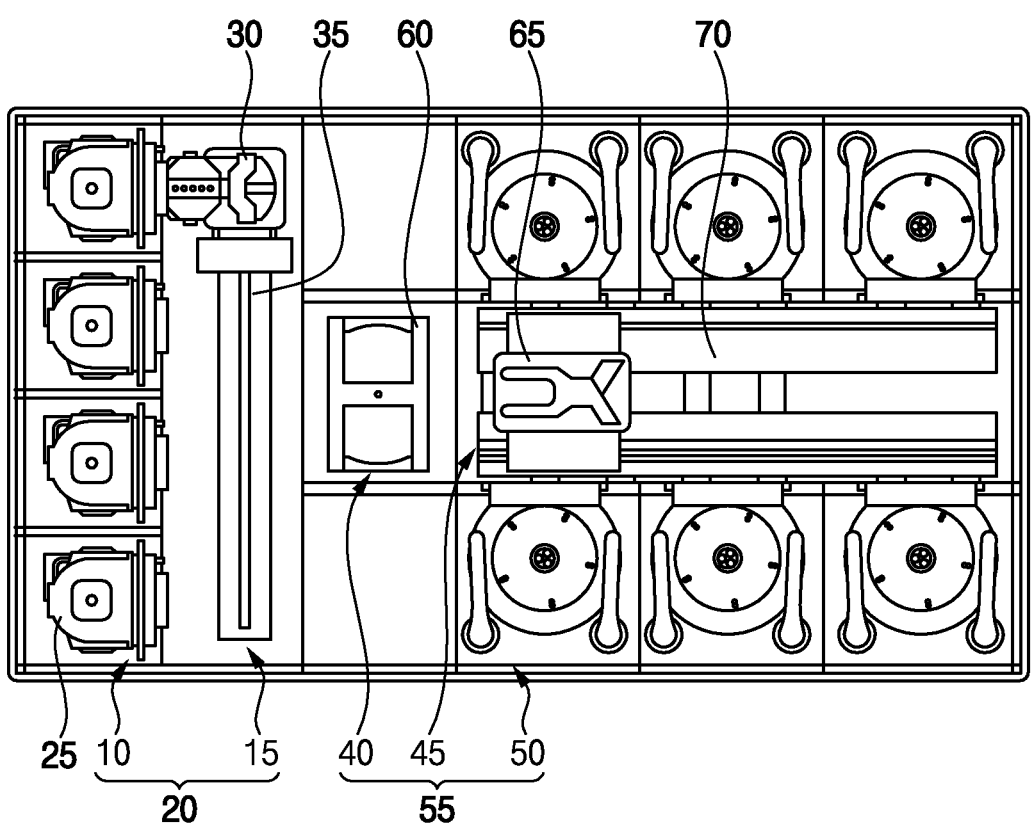
FIG. 1 is a schematic plan view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/ or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating an apparatus for processing a substrate in accordance with example embodiments of the invention.

Referring to FIG. 1, the apparatus for processing a substrate according to example embodiments may include an index module 20 and a processing module 55.

The index module 20 may transfer a substrate into the processing module 55 from an outside and the processing module 55 may performed desired processes on the substrate. Here, the substrate may be utilized for manufacturing an integrated circuit device including a semiconductor device or a display device including a flat panel display device. For example, the substrate may include a silicon wafer, a glass substrate, an organic substrate, etc.

The index module 20 may include a transfer frame 15. A cassette 25 capable of receiving the substrate may be loaded in a road chamber 10. For example, the carrier 25 may include a front opening unified pod (FOUP). The carrier 25 may be transferred into the road chamfer 10 from the outside or may be transferred from the road chamber 10 to the outside by an overhead transfer (OHT).

The transfer frame 15 may transfer the substrate between the processing module 55 and the carrier 25 loaned in the road chamber 10. The transfer frame 15 may include an index robot 30 and an index rail 35.

The index robot 30 may move along the index rail 35 and may transfer the substrate between the index module 20 and the processing module 55. For example, the index robot 30 may transfer the substrate between the carrier 25 and a buffer slot 50 while moving on the index rail 35.

As illustrated in FIG. 1, the processing module 55 may perform the desired processes including, but not limited to, a deposition process, an etching process, a coating process, an exposure process, a developing process, a cleaning process, or a drying process, on the substrate. The processing module 55 may include a buffer chamber 40, a transfer chamber 45, a process chamber 50, a control unit (not illustrated), etc.

The substrate transferred between the index module 20 and the processing module 55 may be temporarily placed in the buffer chamber 40. The buffer slot 60 may be disposed in the buffer chamber 40. In example embodiments, a plurality of buffer slots 60 may be provided in the buffer chamber 40 such that a plurality of substrate may be located in the buffer chamber 40.

The transfer chamber 45 may transfer the substrate between the buffer chamber 40 and the process chamber 50. The transfer chamber 45 may include a transfer robot 65 and a transfer rail 70. The transfer robot 65 may move along the transfer tail 70 and may transfer the substrate between the buffer chamber 40 and the process chamber 50. For example, the transfer robot 65 may transfer the substrate(s) placed on the buffer slot 60 into the process chamber 50 while moving on the transfer rail 70.

In example embodiments, the apparatus for processing a substrate may include a plurality of process chambers 50. The plurality of process chambers 50 may carried out the desired processes including the deposition process, the etching process, the coating process, the exposure process, the developing process, the cleaning process, or the drying process, respectively. In other words, the plurality of process chambers 50 may include a deposition chamber, a coating chamber, an exposure chamber, a developing chamber, an etching chamber, a cleaning chamber, or a drying chamber. In this case, each of the process chambers 50 may include a door being opened and closed for loading and unloading of the substrate. In example embodiments, the apparatus for processing a substrate may include a cleaning device that may remove particles and/or impurities from the substrate after and/or before the desired processes are executed in the process chambers 50.

Figure 2:
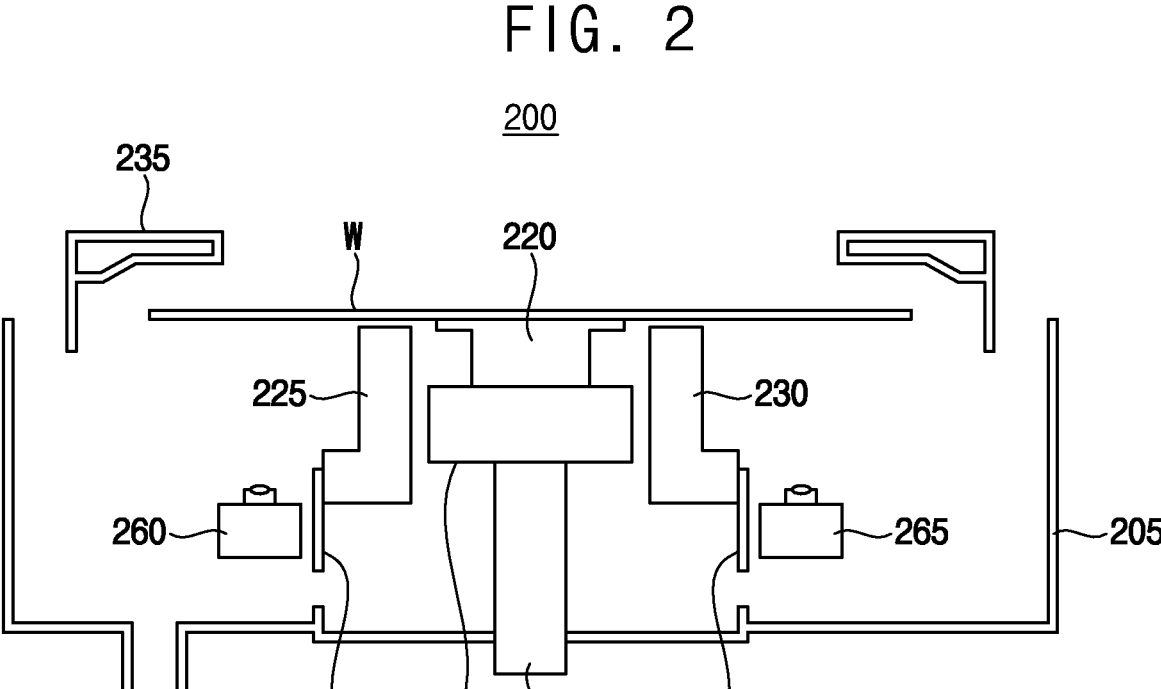
FIG. 2 is a schematic cross-sectional view illustrating an apparatus for processing a substrate in accordance with example embodiments of the invention.

FIG. 2 is a schematic cross-sectional view illustrating an apparatus for processing a substrate in accordance with example embodiments of the invention. In example embodiments, the process chamber 50 may be the exposure chamber. Here, the cleaning device may clean a rear face of a substrate after the substrate is loaded into the exposure chamber and/or before the substrate is unloaded from the exposure chamber. Alternatively, the cleaning device may clean the rear face(s) of the substrate(s) before the substrate (s) are loaded into the process chambers 50 and/or after the substrate(s) are unloaded from the process chambers 50

Referring to FIG. 2, a cleaning device 200 according to example embodiments may include a first housing 205, a second housing 235, an electrostatic chuck 220, a driving member 250, at least one adsorption member, a circulation member 280, at least one nozzle and at least one auxiliary circulation member. In this case, the circulation member 280 may be coupled to the driving member 250 and the at least one auxiliary circulation member may be disposed adjacent to the circulation member 280. Additionally, the at least one nozzle may be positioned adjacent to the at least one auxiliary circulation member. For example, the at least one auxiliary circulation member may be disposed between the circulation member 280 and the at least one nozzle. According to example embodiments, the cleaning device 200 may have, in the first housing 205, a configuration in which a circulation pathway including a circulation hole in the at least auxiliary circulation member extends from the circulation member 280, passes between the at least one adsorption member and the rear face of the substrate W, and passes between the at least one nozzle and an inner sidewall of the first housing 205, and returns to the circulation member 280.

The first housing 205 may have, but not limited to, a substantially rectangular open-top planar shape. Alternatively, the first housing 205 may have a substantially circular open-top planar shape. An outlet 110 may be provided in the bottom of the first housing 205. The second housing 235 may be coupled to the first housing 205 and may substantially cover the substrate W. The second housing 235 may have a size substantially smaller than that of the first housing 205. The second housing 235 may prevent the cleaning solution from being scattered upwardly from the substrate W in a cleaning process.

In example embodiments, the cleaning device 200 may include a first adsorption member 225 and a second adsorption member 230. Each of the first adsorption member 225 and the second adsorption member 230 may absorb the substrate W and may transfer the substrate W onto the electrostatic chuck 220. For example, each of the first adsorption member 225 and the second adsorption member 230 may absorb the substrate W using a vacuum pressure, and then move the substrate W onto the electrostatic chuck 220. Here, peripheral portions of the substrate W may be absorbed by the first and second adsorption members 225 and 230, and a central portion of the substrate W may be located on a center of the electrostatic chuck 220.

The substrate W may be placed on the electrostatic chuck 220 by the first and second adsorption members 225 and 230. The electrostatic chuck 220 may absorb the substrate W, for example, using an electrostatic force. The electrostatic chuck 220 may have, but not limited to, a substantially circular planar shape. The electrostatic chuck 220 may rotate the substrate W while the cleaning solution is provided onto the rear face of the substrate W from the at least one nozzle.

The electrostatic chuck 220 may be connected to the driving member 250. The driving member 250 may move the electrostatic chuck 220 in an upward direction and a downward direction and also may rotate the electrostatic chuck 220. For example, the driving member 250 may include a rotation shaft that may move upwardly and downwardly in the first housing 205.

As illustrated in FIG. 2, the circulation member 280 may prevent the scattering of the cleaning solution. The circulation member 280 may be coupled to the driving member 250. For example, the circulation member 280 may be fixed to an outer circumference face of the driving member 250. As further described below, the circulation member 280 may circulate an airflow along the circulation pathway in the first housing 205. In other words, the circulation member 280 may form the airflow circulating along the circulation pathway in the first housing 205. Here, the circulation member 280 may rotate along with the driving member 250. For example, the circulation member 280 may be rotated in accordance with the rotation of the driving member 250.

In example embodiments, the circulation member 280 may include a turbine blade or a fan capable of forming the airflow circulating in the circulation pathway, but the invention is not limited thereto. The circulation member 280 may include any device which may include blades to form the airflow. In this case, the direction of the airflow may be changed in accordance with the arrangement of the blades of the circulation member 280. An opening may be provided in a central portion of the circulation member 280 through which the driving member 250 passes. Thus, the circulation member 250 may be engaged with the driving member 250 and the driving member 250 may rotate the circulation member 280 to generate the airflow circulating in the first housing 205. In some example embodiments, the cleaning device 200 may include a fixing member (not illustrated) such as a clamp or a nut which may be coupled to the circulation member 280 for securely fixing the circulation member 280 to the driving member 250.

According to example embodiments, the cleaning device 200 may include a first auxiliary circulation member 270 and a second auxiliary circulation member 275. The first auxiliary circulation member 270 may be disposed adjacent to the first adsorption member 225 and the second circulation 275 may be positioned adjacent to the second adsorption member 230. One end portion of the first auxiliary circulation member 270 may be connected to the first adsorption member 225 and the other end portion of the first auxiliary circulation member 270 may be coupled to a bottom of the first housing 205. Further, one end portion of the second auxiliary circulation member 275 may be connected to the second adsorption member 230 and the other end portion of the second auxiliary circulation member 275 may be coupled to the bottom of the first housing 205. In this case, the first auxiliary circulation member 270 and the second auxiliary circulation member 275 may make contact with the bottom of the first housing 205 and may extend between the inner sidewalls of the first housing 205.

In example embodiments, each of the first and second auxiliary circulation members 270 and 275 may have a circulation hole. For example, each of first and second auxiliary circulation members 270 and 275 may have a substantial plate shape and the circulation hole may pass through the plate. As further described below, each of the first and second auxiliary circulation members 270 and 275 having the circulation hole may form a portion of the circulation pathway along which the airflow generated by the circulation member 280 circulates in the first housing 205.

As illustrated in FIG. 2, the cleaning device 200 may include a first nozzle 260 and a second nozzle 265. The first nozzle 260 may be disposed adjacent to the first auxiliary circulation member 270 and the second nozzle 265 may be located adjacent to the second auxiliary circulation member 275. The first and second nozzles 260 and 265 may substantially face the peripheral portions of the substrate W. Each of the first and second nozzles 260 and 265 may spray the cleaning solution onto the rear face of the substrate W to remove the particles and/or the impurities from the rear face of the substrate W. To this end, the circulation pathway may be provided in the first housing 205. The circulation pathway may be formed in the circulation hole of the first auxiliary circulation member 270, between the first adsorption member 225 and the rear face of the substrate W, between the first nozzle 260 and the inner sidewall of the first housing 205, between the second adsorption member 230 and the rear face of the substrate W, between the second nozzle 275 and the inner sidewall of the first housing 205, and in and the circulation hole of the second auxiliary circulation member 275.

Figure 3:
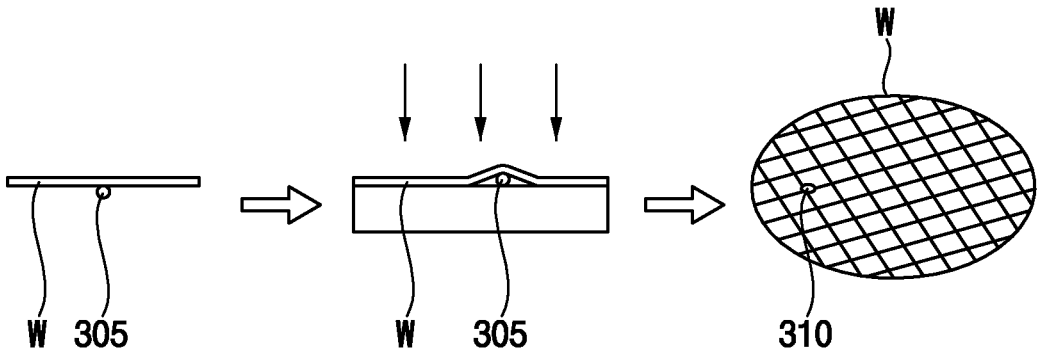
FIG. 3 is a schematic diagram illustrating a problem in the conventional exposure process performed on a rear face of a substrate having a remaining particle thereon.

FIG. 3 is a schematic diagram illustrating a problem in the conventional exposure process performed on a rear face of a substrate W having a remaining particle thereon.

In general, a precise exposure process may be performed on the substrate W to form minute patterns on the substrate W as the semiconductor device or a display device demands the minute patterns. As illustrated in FIG. 3, if a particle 305 or an impurity remains on the rear face of the substrate W in the precise exposure process, the substrate W may be bent by the particle 305 or the impurity such that defocus phenomenon may be locally caused in the exposure process. As result, a defect 310 may be generated in the minute patterns formed on the substrate W. The cleaning process may be executed about the rear face of the substrate W so as to prevent such local defocus phenomenon in the exposure process. Such cleaning process may be performed on the rear face of the substrate W before the substrate W is loaded into the exposure chamber and/or after the substrate W is unloaded from the exposure chamber.

Figure 4:
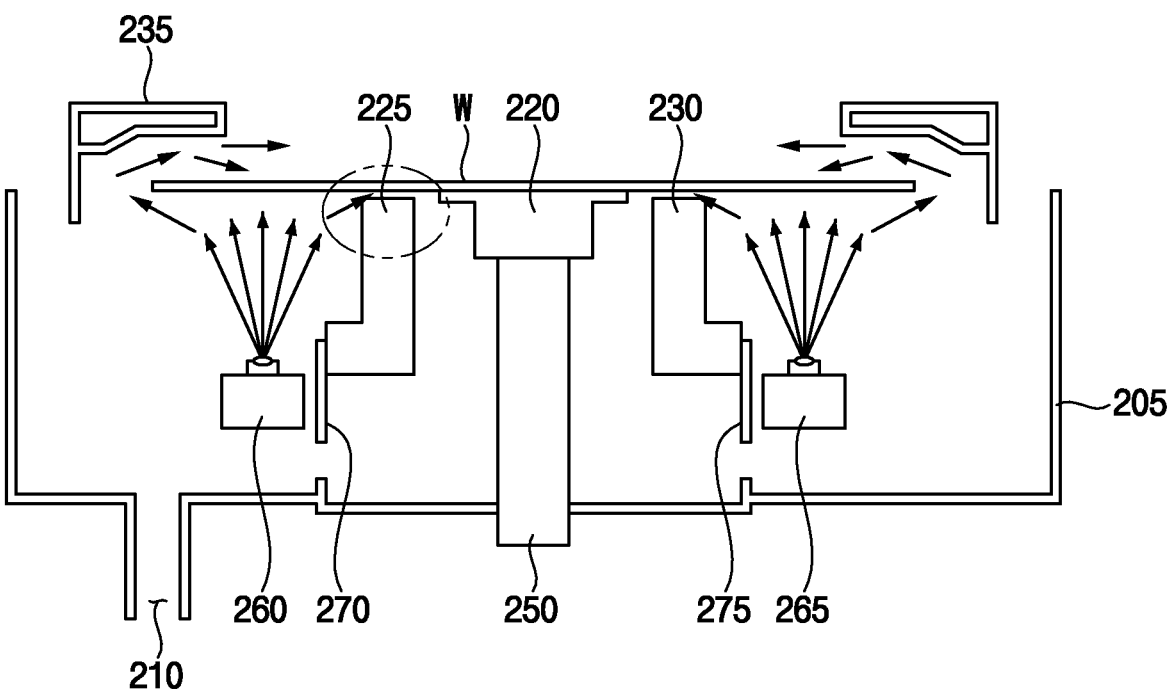
FIG. 4 is a schematic cross-sectional view illustrating a cleaning process performed using a cleaning device without a circulation member.
Figure 5:
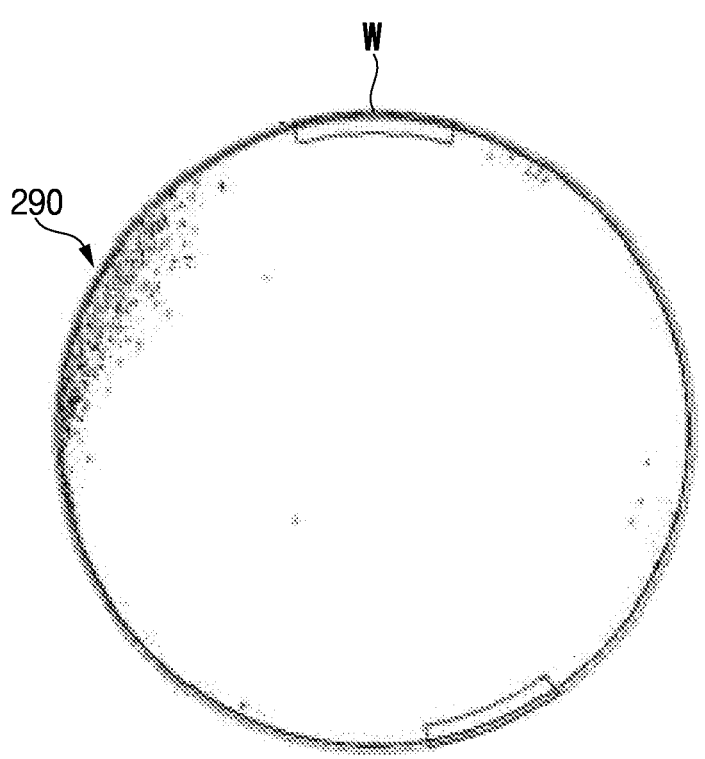
FIG. 5 is a schematic plan view illustrating defects generated on a front face of a substrate caused by a cleaning solution.

FIG. 4 is a schematic cross-sectional view illustrating a cleaning process performed using a cleaning device without a circulation member. FIG. 5 is a schematic plan view illustrating defects generated on a front face of a substrate caused by a cleaning solution.

As illustrated in FIG. 4, the cleaning solution may be sprayed onto the rear face of the substrate W from the first and second nozzles 260 and 265 to wash the rear face of the substrate W as indicated by an arrow. The cleaning solution may remove the particles and/or the impurities from the rear face of the substrate W. The cleaning solution may include, but not limited to, deionized water.

When the cleaning process is executed about the rear face of the substrate W, the cleaning solution may be sprayed from the first and second nozzles 260 and 265 onto the rear face of the substrate W rotating on the electrostatic chuck 220 so that the cleaning solution may be scattered toward the inner sidewall of the first housing 205, and then may be dispersed on the front face of the substrate W. Further, a portion of the cleaning solution may pass through between the rear face of the substrate W and the first and second adsorption members 225 and 230 to be permeated into the electrostatic chuck 220. When the cleaning solution remains on the front face of the substrate W, defects such as water marks or stains may be generated on the peripheral portion of the front face of the substrate W as illustrated in FIG. 5.

Figure 6:
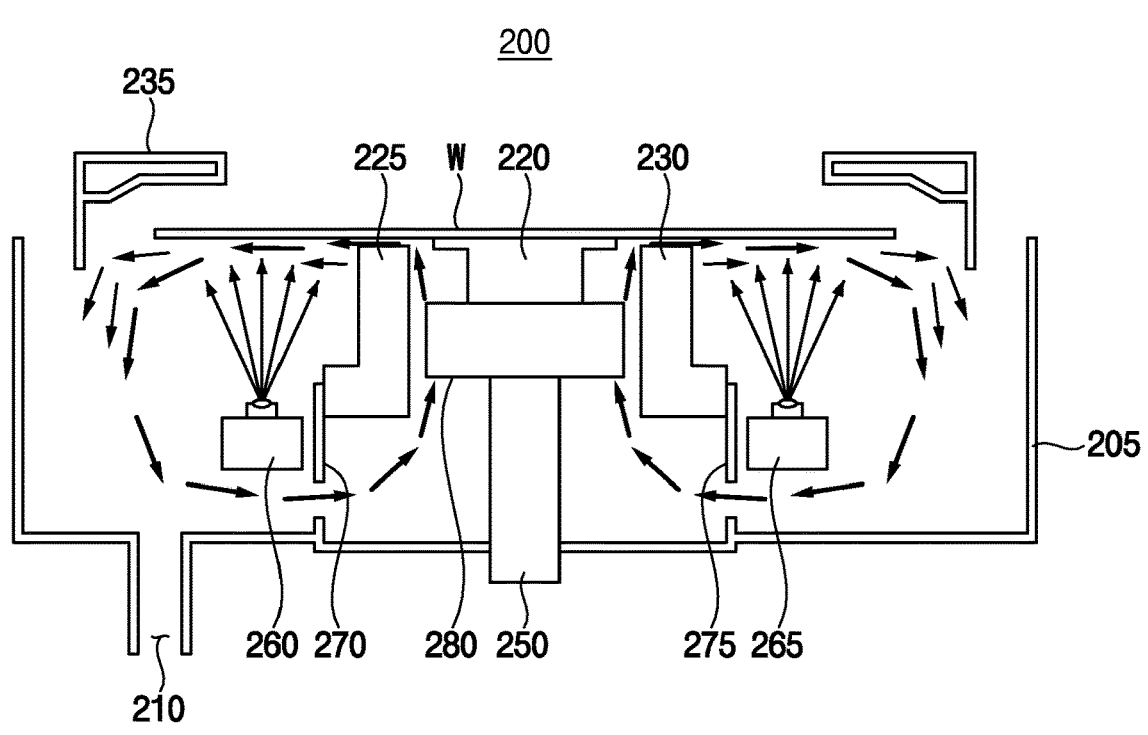
FIG. 6 is a schematic cross-sectional view illustrating a cleaning process performed using a cleaning device including a circulation member in accordance with example embodiments of the invention.

FIG. 6 is a schematic cross-sectional view illustrating a cleaning process performed using a cleaning device including a circulation member in accordance with example embodiments of the invention.

Referring to FIG. 6, the cleaning device 200 according to example embodiments may include the circulation member 280 which may be engaged with the driving member 250 and may be rotated by the driving member 250. The circulation member 280 may form the airflow circulating in the first housing 205 as indicated by arrows.

To provide the circulating airflow in the first housing 205, the first and second auxiliary circulation members 270 may include the circulation holes, respectively. Hence, the circulating airflow may flow among the first and second adsorption members 225 and 230, the rear face of the substrate W, and the first and second auxiliary circulation members 270 and 275. Specifically, the airflow generated by the circulation member 280 may be circulated between the first adsorption member 225 and the rear face of the substrate W, between the first nozzle 260 and the inner sidewall of the first housing 205, in the circulation hole of the first auxiliary circulation member 270, between the second adsorption member 230 and the rear face of the substrate W, between the second nozzle 265 and the inner sidewall of the first housing 205, and in the circulation hole of the second auxiliary circulation member 275. In other words, the airflow generated by the circulation member 280 may flow along the circulation pathway in the first housing 205.

In example embodiments, the circulating airflow may be generated by the circulation member 280 in the first housing 205, and thus, while the cleaning solution is sprayed from the first and second nozzles 260 and 265 onto the rear face of the substrate W, the cleaning solution may not be dispersed onto the front face of the substrate W as well as may not be scattered toward the electrostatic chuck 220 as indicated by arrows. As a result, the rear face of the substrate W may be effectively cleaned while preventing the defects from being generated on the front face of the substrate W. Additionally, a failure of the electrostatic chuck 220 caused by the cleaning solution may be prevented.

Figure 7:
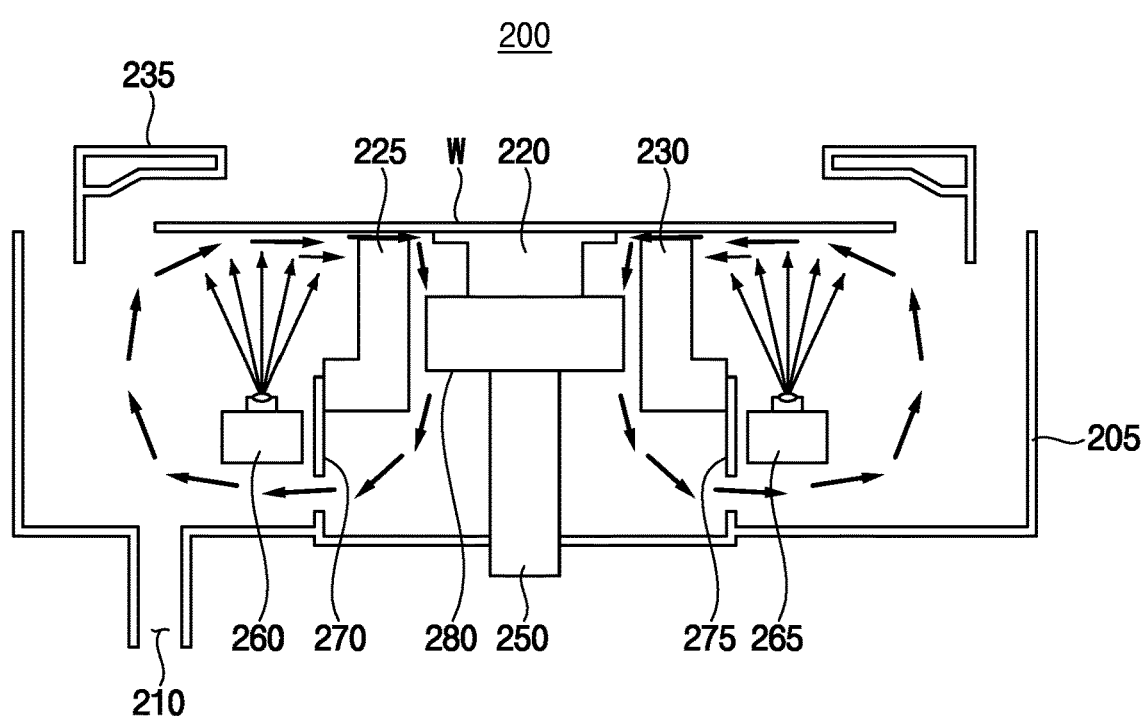
FIG. 7 is a schematic cross-sectional view illustrating a cleaning process performed using a cleaning device including a circulation member in accordance with some example embodiments of the invention.

FIG. 7 is a schematic cross-sectional view illustrating a cleaning process performed using a cleaning device including a circulation member in accordance with some example embodiments of the invention.

Referring to FIG. 7, as indicated by arrows, the cleaning member 280 may circulate the airflow in a direction substantially opposed to that of the airflow described with reference to FIG. 6. In other words, the airflow may pass the first and second auxiliary circulation members 270 and 275, the rear face of the substrate W and the first and second adsorption members 225 and 230 from the circulation member 280 in the first housing 205. The direction in which the airflow flows may be changed by modifying the arrangement of the blades of the circulation member 280. For example, by changing the arrangement of blades of the turbine blade or the fan, the direction of the circulating airflow may be changed in the first housing 205. Therefore, it may be effectively prevented that the cleaning solution sprayed from the first and second nozzles 260 and 265 may be scattered onto the front face of the substrate W as indicated by arrows. As a result, the cleaning device 200 may efficiently prevent the defects from being generated on the front face of the substrate W.

According to example embodiments of the invention, the rear face of the substrate may be effectively cleaned using the cleaning device including the circulation member and the at least one auxiliary circulation member while preventing the defects from being generated on the front face of the substrate. Therefore, the reliability of the semiconductor device or display device may be enhanced using the apparatus for processing a substrate including such a cleaning device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A cleaning device for cleaning a rear face of a substrate, which comprises:
   a housing;
   an electrostatic chuck in the housing, the electrostatic chuck being configured to hold the substrate on the electrostatic chuck;
   at least one adsorption member configured to place the substrate onto the electrostatic chuck;
   a driving member configured to rotate the electrostatic chuck;
   a circulation member coupled to the driving member, the circulation member being configured to form a circulating airflow in the housing for preventing scattering of a cleaning solution while the cleaning solution is being applied onto the rear face of the substrate;
   at least one auxiliary circulation member disposed adjacent to the circulation member, the at least one auxiliary circulation member defining a circulation hole for the circulating airflow; and
   at least one nozzle disposed adjacent to the at least one auxiliary circulation member, the at least one nozzle being configured to apply the cleaning solution onto the rear face of the substrate.

2. The cleaning device of claim 1, wherein the cleaning device includes a first adsorption member and a second adsorption member configured to adsorb peripheral portions of the substrate, respectively.

3. The cleaning device of claim 1, wherein the circulation member defines an opening through which the driving member passes and the circulation member is engaged with an outer circumference face of the driving member.

4. The cleaning device of claim 3, wherein the circulation member includes blades configured to generate the airflow in the housing.

5. The cleaning device of claim 4, wherein a direction of the airflow is changed in the housing by changing an arrangement of the blades of the circulation member.

6. The cleaning device of claim 3, further comprising:
   a fixing member configured to fix the circulation member to the driving member.

7. The cleaning device of claim 1, wherein the cleaning device includes a first auxiliary circulation member and a second auxiliary circulation member, each of the first and second auxiliary circulation members having the circulation hole through which the airflow passes.

8. The cleaning device of claim 7, wherein each of the first auxiliary circulation member and the second auxiliary circulation member contact a bottom of the housing and extend between inner sidewalls of the housing.

9. The cleaning device of claim 1, wherein the airflow is configured to circulate along a circulation pathway formed between the at least one adsorption member and the rear face of the substrate, between the at least one nozzle and an inner sidewall of the housing, and in the circulation hole of the at least one auxiliary circulation member.

10. A cleaning device for cleaning a rear face of a substrate, which comprises:
   a housing;
   an electrostatic chuck in the housing, the electrostatic chuck being configured to hold the substrate on the electrostatic chuck;
   a first adsorption member and a second adsorption member configured to place the substrate onto the electrostatic chuck;
   a driving member configured to rotate the electrostatic chuck;
   a circulation member coupled to the driving member, the circulation member being configured to form a circulating airflow in the housing for preventing scattering of a cleaning solution;
   a first auxiliary circulation member and a second auxiliary circulation member disposed adjacent to the circulation member, respectively, each of the the first auxiliary circulation member and the second auxiliary circulation members defining a circulation hole for the circulating airflow; and
   a first nozzle and a second nozzle disposed adjacent to the first auxiliary circulation member and the second auxiliary circulation member, respectively, the a first nozzle and a second nozzle being configured to apply the cleaning solution onto the rear face of the substrate.

11. The cleaning device of claim 10, further comprising:
   a fixing member configured to fix the circulation member to the driving member.

12. The cleaning device of claim 10, wherein the circulation member includes blades for generating the airflow in the housing.

13. The cleaning device of claim 12, wherein a direction of the airflow is changed in the housing by changing an arrangement of the blades of the circulation member.

14. The cleaning device of claim 10, wherein each of the first auxiliary circulation member and the second auxiliary circulation member contacts a bottom of the housing and extends between inner sidewalls of the housing.

15. The cleaning device of claim 10, wherein the airflow is configured to circulate a circulation pathway formed between the first adsorption member and the rear face of the substrate, between the first nozzle and an inner sidewall of the housing, in the circulation hole of the first auxiliary circulation member, between the second adsorption member and the rear face of the substrate, between the second nozzle and the inner sidewall of the housing, and in the circulation hole of the second auxiliary circulation member.

16. An apparatus for processing a substrate comprising:
   a process chamber configured to perform a desired process on the substrate; and
   a cleaning device configured to clean a rear face of the substrate before the substrate is loaded into the process chamber and/or after the substrate is unloaded from the process chamber, the cleaning device comprising:

a housing;

an electrostatic chuck in the housing, the electrostatic chuck being configured to hold the substrate on the electrostatic chuck;

a first adsorption member and a second a first adsorption member configured to place the substrate onto the electrostatic chuck;

a driving member configured to rotate the electrostatic chuck;

a circulation member coupled to the driving member, the circulation member being configured to form a circulating airflow in the housing for preventing scattering of a cleaning solution;

a first auxiliary circulation member and a second auxiliary circulation member disposed adjacent to the circulation member, respectively, the first auxiliary circulation member and the second auxiliary circulation member each defining a circulation hole for the circulating airflow; and a first nozzle and a second nozzle disposed adjacent to the first auxiliary circulation member and the second auxiliary circulation member, respectively, the first nozzle and the second nozzle being configured to apply the cleaning solution onto the rear face of the substrate.

17. The apparatus for processing a substrate of claim 16, wherein the process chamber includes an exposure chamber.

18. The apparatus for processing a substrate of claim 16, wherein the circulation member includes blades configured to generate the airflow in the housing and a direction of the airflow is changed in the housing by changing an arrangement of the blades of the circulation member.

19. The apparatus for processing a substrate of claim 16, wherein each of the first auxiliary circulation member and the second auxiliary circulation member contact a bottom of the housing and extend between inner sidewalls of the housing.

20. The apparatus for processing a substrate of claim 16, wherein the airflow is configured to circulate a circulation pathway formed between the first adsorption member and the rear face of the substrate, between the first nozzle and an inner sidewall of the housing, in the circulation hole of the first auxiliary circulation member, between the second adsorption member and the rear face of the substrate, between the second nozzle and the inner sidewall of the housing, and in the circulation hole of the second auxiliary circulation member.

* * * * *